United States Patent
Camsari et al.

(10) Patent No.: US 10,790,441 B2
(45) Date of Patent: Sep. 29, 2020

(54) SPIN-TRANSFER-TORQUE SYNTHETIC ANTI-FERROMAGNETIC SWITCHING DEVICE

(71) Applicant: Purdue Research Foundation, West Lafayette, IN (US)

(72) Inventors: Kerem Y. Camsari, Lafayette, IN (US); Ahmed Zeeshan Pervaiz, West Lafayette, IN (US); Rafatul Faria, West Lafayette, IN (US); Esteban E Marinero-Caceres, West Lafayette, IN (US); Supriyo Datta, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 16/085,450

(22) PCT Filed: Mar. 14, 2017

(86) PCT No.: PCT/US2017/022383
§ 371 (c)(1),
(2) Date: Sep. 14, 2018

(87) PCT Pub. No.: WO2017/160893
PCT Pub. Date: Sep. 21, 2017

(65) Prior Publication Data
US 2019/0081236 A1    Mar. 14, 2019

Related U.S. Application Data

(60) Provisional application No. 62/307,953, filed on Mar. 14, 2016.

(51) Int. Cl.
*H01L 43/10* (2006.01)
*G11C 11/16* (2006.01)
(Continued)

(52) U.S. Cl.
CPC ............ *H01L 43/10* (2013.01); *G11C 11/161* (2013.01); *G11C 11/1659* (2013.01);
(Continued)

(58) Field of Classification Search
CPC ......... H01L 43/10; H01L 43/08; H01L 43/06; G11C 11/1659; G11C 11/161; G11C 11/1675; G11C 11/18
(Continued)

(56) References Cited

U.S. PATENT DOCUMENTS

| 2005/0061658 | A1 | 3/2005 | Lin et al. |
| 2007/0086121 | A1* | 4/2007 | Nagase ................. B82Y 25/00 360/324.1 |

(Continued)

OTHER PUBLICATIONS

S. Zoll, A. Dinia, D. Stoeffler, M. Gester, H. Van Den Berg, and K. Ounadjela, "Preserved interfacial magnetism and giant antiferromagnetic exchange coupling in co/rh sandwiches," EPL, vol. 39, No. 3, p. 323, 1997.
(Continued)

*Primary Examiner* — Dao H Nguyen
(74) *Attorney, Agent, or Firm* — Piroozi-IP, LLC

(57) ABSTRACT

A switching device, comprising an anti-ferromagnet structure having an upper layer and a lower layer, the upper layer and lower layer anti-ferromagnetically coupled by an exchange coupling layer, the upper and lower layer formed of a similar material but having differing volumes, and wherein the device is configured to inject symmetrically spin-polarized currents through the upper and lower layers to achieve magnetic switching of the anti-ferromagnet structure.

15 Claims, 14 Drawing Sheets

(51) Int. Cl.
    *G11C 11/18*       (2006.01)
    *H01L 43/06*       (2006.01)
    *H01L 43/08*       (2006.01)

(52) U.S. Cl.
    CPC .......... *G11C 11/1675* (2013.01); *G11C 11/18* (2013.01); *H01L 43/06* (2013.01); *H01L 43/08* (2013.01)

(58) Field of Classification Search
    USPC .............. 257/421, E21.665, E29.323; 438/3; 365/198.04, 189.09, 49.13, 154, 171, 173
    See application file for complete search history.

(56) References Cited

U.S. PATENT DOCUMENTS

| | | | |
|---|---|---|---|
| 2008/0258247 A1* | 10/2008 | Mancoff | G11C 11/16 257/421 |
| 2012/0023386 A1* | 1/2012 | Oh | H01L 43/08 714/769 |
| 2015/0056368 A1 | 2/2015 | Wang et al. | |
| 2015/0213868 A1 | 7/2015 | Wu et al. | |
| 2017/0125481 A1* | 5/2017 | Kan | G11C 11/161 |

OTHER PUBLICATIONS

Y. Zou, J. Wang, C. Hee, and T. Chong, "Tilted media in a perpendicular recording system for high areal density recording," Applied physics letters, vol. 82, No. 15, pp. 2473-2475, 2003.
S.-C. Oh, S.-Y. Park, A. Manchon, M. Chshiev, J.-H. Han, H.-W. Lee, J.-E. Lee, K.-T. Nam, Y. Jo, Y.-C. Kong, "Bias-voltage dependence of perpendicular spin-transfer torque in asymmetric mgo-based magnetic tunnel functions," Nature Physics, vol. 5, No. 12, pp. 898-902, 2009.
L. Berger, "Multilayer configuration for experiments of spin precession induced by a dc current," Journal of Applied Physics, vol. 93, No. 10, pp. 7693-7695, 2003.
G. Fuchs, I. Krivorotov, P. Braganca, N. Emley, A. Garcia, D. Ralph, and R. Buhrman, "Adjustable spin torque in magnetic tunnel junctions with two fixed layers," Applied Physics Letters, vol. 86, No. 15, p. 152509, 2005.
H. Meng, J. Wang, and J.-P. Wang, "Low critical current for spin transfer in magnetic tunnel junctions," Applied Physics Letters, vol. 88, No. 8, p. 082504, 2006.
P.-Y. Clement, C. Baraduc, C. Ducruet, L. Vila, M. Chshiev, and ' B. Dieny, "Modulation of spin transfer torque amplitude in double ' barrier magnetic tunnel junctions," Applied Physics Letters, vol. 107, No. 10, p. 102405, 2015.
K. Eid, R. Fonck, M. A. Darwish, W. Pratt Jr, and J. Bass, "Currentperpendicular-to-plane-magnetoresistance properties of ru and co/ru interfaces," Journal of applied physics, vol. 91, No. 10, pp. 8102-8104, 2002.
S. Hernandez and R. Victora, "Calculation of spin transfer torque in ' partially polarized spin valves including multiple reflections," Applied Physics Letters, vol. 97, No. 6, p. 062506, 2010.
D. Datta, B. Benin-Aein, S. Datta, and S. Salahuddin, "Voltage asymmetry of spin-transfer torques," IEEE Transactions on Nanotechnology, vol. 11, No. 2, pp. 261-272, 2012.
B. Ghosh and K. Dwivedi, "Micromagnetic analysis of a double-barrier synthetic antiferromagnetic mtj stack," Applied Nanoscience, pp. 1-5, 2014.
R. Victora and X. Shen, "Composite media for perpendicular magnetic recording," Magnetics, IEEE Transactions on, vol. 41, No. 2, pp. 537-542, 2005.
J.-P. Wang, W. Shen, and J. Bai, "Exchange coupled composite media for perpendicular magnetic recording," IEEE ransactions on magnetics, vol. 41, No. 10, pp. 3181-3186, 2005.

H. Richter, "The transition from longitudinal to perpendicular recording," Journal of Physics D: Applied Physics, vol. 40, No. 9, p. R149, 2007.
S. Yakata, H. Kubota, T. Sugano, T. Seki, K Yakushiji, A. Fukushima, S. Yuasa, and K. Ando, "Thermal stability and spin-transfer switchings in mgo-based magnetic tunnel junctions with ferromagnetically and antiferromagnetically coupled synthetic free layers," Applied Physics Letters, vol. 95, No. 24, p. 242504, 2009.
J. Hayakawa, S. Ikeda, K. Miura, M. Yamanouchi, Y. M. Lee, R. Sasaki, M. Ichimura, K Ito, T. Kawahara, R. Takemura, "Current-induced magnetization switching in mgo barrier magnetic tunnel junctions with cofeb-based synthetic ferrimagnetic free layers," Magnetics, IEEE Transactions on, vol. 44, No. 7, pp. 1962-1967, 2008.
I. Yulaev, M. Lubarda, S. Mangin, V. Lomakin, and E. E. Fullerton, "Spin-transfer-torque reversal in perpendicular anisotropy spin valves with composite free layers," Applied Physics Letters, vol. 99, No. 13, p. 132502, 2011.
R. Victora and X. Chen, "Exchange-assisted spin transfer torque switching," 2012, U.S. Pat. No. 8,134,864.
H. Meng and J.-P. Wang, "Spin transfer effect in magnetic tunnel junction with a nano-current-channel layer in free layer," Magnetics, IEEE Transactions on, vol. 41, No. 10, pp. 2612-2614, 2005.
H. Meng and J. Wang, "Composite free layer for high density magnetic random access memory with lower spin transfer current," Applied physics letters, vol. 89, No. 15, p. 152509, 2006.
C.-T. Yen, W.-C. Chen, D.-Y. Wang, Y.-J. Lee, C.-T. Shen, S.-Y. Yang, C.-H. Tsai, C.-C. Hung, K.-H. Shen, M.-J. Tsai, "Reduction in critical current density for spin torque transfer switching with composite free layer," Applied Physics Letters, vol. 93, No. 9, p. 2504, 2008.
H. Zhao, B. Glass, P. K. Amiri, A. Lyle, Y. Zhang, Y.-J. Chen, G. Rowlands, P. Upadhyaya, Z. Zeng, J. Katine, "Sub-200 ps spin transfer torque switching in in-plane magnetic tunnel junctions with interface perpendicular anisotropy," Journal of Physics D: Applied Physics, vol. 45, No. 2, p. 025001, 2011.
A. D. Kent and D. C. Worledge, "A new spin on magnetic memories," Nature nanotechnology, vol. 10, No. 3, pp. 187-191, 2015.
E. E. Fullerton, D. Margulies, M. E. Schabes, M. Carey, B. Gurney, A. Moser, M. Best, G. Zeltzer, K. Rubin, H. Rosen, "Antiferromagnetically coupled magnetic media layers for thermally stable highdensity recording," Applied Physics Letters, vol. 77, No. 23, pp. 3806-3808, 2000.
T. Taniguchi and H. Imamura, "Theoretical study on dependence of thermal switching time of synthetic free layer on coupling field," Journal of Applied Physics, vol. 111, No. 7, p. 07C901, 2012.
W. H. Butler, T. Mewes, C. K. Mewes, P. Visscher, W. H. Rippard, S. E. Russek, and R. Heindl, "Switching distributions for perpendicular spintorque devices within the macrospin approximation," IEEE Transactions on Magnetics, vol. 48, No. 12, pp. 4684-4700, 2012.
J. Sun, "Spin-current interaction with a monodomain magnetic body: A model study," Physical Review B, vol. 62, No. 1, p. 570, 2000.
B. Behin-Aein, A. Sarkar, S. Srinivasan, and S. Datta, "Switching energy-delay of all spin logic devices," Applied Physics Letters, vol. 98, No. 12, p. 123510, 2011.
S. S. Parkin, "Systematic variation of the strength and oscillation period of indirect magnetic exchange coupling through the 3d, 4d, and 5d transition metals," Physical Review Letters, vol. 67, No. 25, p. 3598, 1991.
S. Zoll, A. Dinia, M. Gester, D. Stoeffler, H. Van Den Berg, A. Herr, R. Poinsot, and H. Rakoto, "Giant antiferromagnetic exchange coupling in ultrahigh-vacuum grown (111) co/rh sandwiches," Journal of magnetism and magnetic materials, vol. 165, No. 1, pp. 442-445, 1997.

* cited by examiner

SPIN-TRANSFER-TORQUE SYNTHETIC ANTI-FERROMAGNETIC SWITCHING DEVICE

CROSS-REFERENCE TO RELATED APPLICATIONS

The present U.S. patent application is a 35 U.S.C. § 371 national phase application of PCT/US17/22383, filed Mar. 14, 2017, which is related to and claims the priority benefit of U.S. Provisional Patent Application Ser. No. 62/307,953, filed Mar. 14, 2016, the contents of which is hereby incorporated by reference in its entirety into the present disclosure.

TECHNICAL FIELD

The present application relates to electronic switching devices, and more specifically, to a spin-transfer-torque switching device having anti-ferromagnetic elements.

BACKGROUND

Exchange coupled magnets have been successfully used in the magnetic recording industry to reduce the magnetic field switching threshold of high magnetic anisotropy materials by coupling them ferromagnetically to lower anisotropy materials. These so-called, "exchange coupled spring magnets" or "graded-anisotropy ferromagnets" enable the reduction of the magnetic grain volume, a necessary requirement for ultra-high density recording, while retaining their thermal stability. Exchange coupled structures are key constituents of commercially available ultra-high magnetic recording density hard disks.

Synthetic ferro- and anti-ferromagnetically coupled magnetic layers have been studied as potential replacements of single ferromagnetic free layers in Magnetic Tunnel Junction (MTJ) stacks in experimental studies. Synthetic antiferromagnets have been of special interest due to the inherent advantages of antiferromagnets such as stray-field free magnetic stacks that can potentially operate at THz frequencies. Spin-torque nano oscillators based on synthetic antiferromagnets have been proposed theoretically. In addition, spin-transfer-torque driven magnetic structures comprising high and low magnetic anisotropy materials have been theoretically analyzed and experimentally investigated. These studies verified that the critical switching current of ferromagnetically coupled magnetic bilayers can be reduced significantly. This is achieved by judicious selection of the magnetic properties of the constituent layers and by controlling the interlayer exchange coupling strength by adjusting the thickness of spacers, such as Ru and Ru-alloys or by intercalating magnetic alloys to achieve the desired exchange coupling strength. For maximum reduction of the critical current to switch these systems, the exchange coupled layers are required to exhibit widely different magnetic properties: anisotropy, saturation magnetization and damping coefficients; making their experimental implementation challenging if not prohibitive. Therefore, improvements are needed in the field.

SUMMARY

The present disclosure provides an electronic switching device based on synthetic anti-ferromagnet (SAFM) structures. It is commonly assumed in the art that to achieve a given switching delay, the current has to exceed the critical current by a certain factor and so a higher critical current implies a higher switching current. However, using the presently disclosed SAFM structures, significantly reduced switching delay for a given current density is provided, even though the critical current is increased. This non-intuitive result can be understood from the requirements of angular momentum conservation. Using perpendicular magnetic anisotropy (PMA) free layer materials in 20 nm diameter MTJ structures, ≈10 picosecond (ps) switching speeds are attainable with SAFM configurations of the present disclosure, provided that a strong exchange coupling between the constituent layers ($J_{ex}$) can be engineered.

According to one aspect, a device is disclosed, comprising an anti-ferromagnet structure having an upper layer and a lower layer, the upper layer and lower layer anti-ferromagnetically coupled by an exchange coupling layer, the upper and lower layer formed of a similar material but having differing volumes, and wherein the device is configured to inject symmetrically spin-polarized currents through the upper and lower layers to achieve magnetic switching of the anti-ferromagnet structure.

According to a further aspect, an electronic memory device is disclosed, comprising a magnetic tunnel junction having an anti-ferromagnet structure having an upper layer and a lower layer, the upper layer and lower layer anti-ferromagnetically coupled by an exchange coupling layer, the upper and lower layer formed of a similar material but having differing volumes, and; an upper reference layer coupled to the upper layer by an upper tunnel barrier layer; and a lower reference layer coupled to the lower layer by a lower tunnel barrier layer.

BRIEF DESCRIPTION OF THE DRAWINGS

In the following description and drawings, identical reference numerals have been used, where possible, to designate identical features that are common to the drawings.

The attached drawings are for purposes of illustration and are not necessarily to scale.

DETAILED DESCRIPTION

In the following description, some aspects will be described in terms that would ordinarily be implemented as software programs. Those skilled in the art will readily recognize that the equivalent of such software can also be constructed in hardware, firmware, or micro-code. Because data-manipulation algorithms and systems are well known, the present description will be directed in particular to algorithms and systems forming part of, or cooperating more directly with, systems and methods described herein. Other aspects of such algorithms and systems, and hardware or software for producing and otherwise processing the signals involved therewith, not specifically shown or described herein, are selected from such systems, algorithms, components, and elements known in the art. Given the systems and methods as described herein, software not specifically shown, suggested, or described herein that is useful for implementation of any aspect is conventional and within the ordinary skill in such arts.

Figure 1:
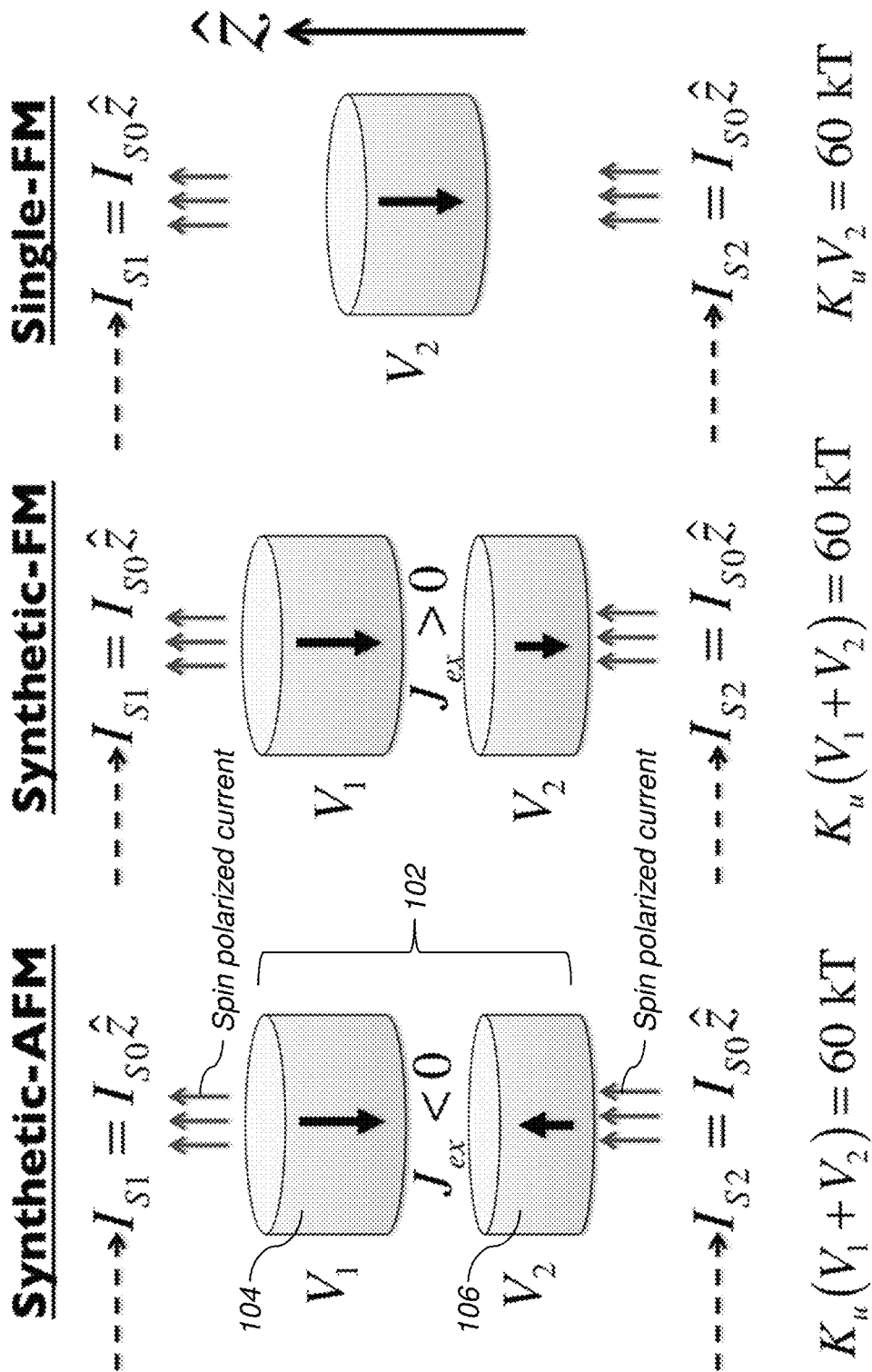
FIG. 1a shows a diagram of a synthetic anti-ferromagnet structure according to various aspects.
FIG. 1b shows a diagram of a synthetic ferromagnet structure.
FIG. 1c shows a diagram of a single domain ferromagnet.

FIG. 1a shows a synthetic anti-ferromagnet 102 having two magnetic domains 104 and 106 according to one embodiment of the present disclosure. Synthetic ferromagnets and single ferromagnetic (FM) layers are shown for comparison in FIG. 1b and FIG. 1c respectively. All the structures analyzed have similar total thermal stability ($\Delta$=60 kT) and it is assumed that this is equal to the sum of those of the constituent layers.

Figure 2:
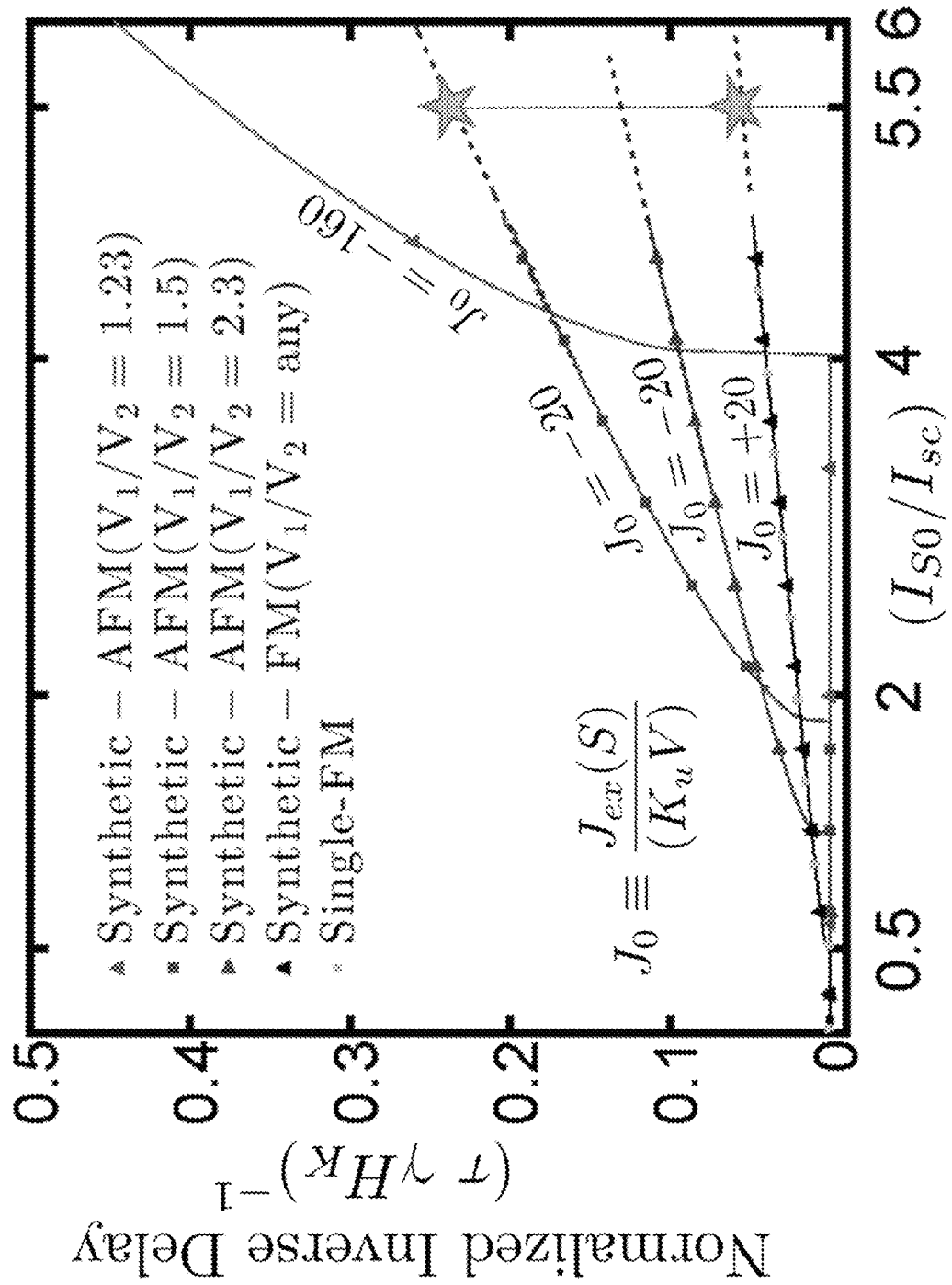
FIGS. 2 and 2a are a graph illustrating inverse switching delay as a function of spin current (FIG. 2) and a graph of switching speed as a function volume ratio (FIG. 2a).

It is commonly assumed in the art that to achieve a given switching delay, the current has to exceed the critical current by a certain factor and therefore a higher critical current implies a higher switching current. However, according to the present disclosure, this is not true for SAFM structures which can provide significantly reduced switching delay for a given current density, even though the critical current is increased in comparison to the ferromagnetic structures. FIG. 2 shows the inverse switching delay as a function of the spin current $I_{S0}$ applied to one of the layers, normalized to the critical switching current of the single FM layer in FIG. 1c. The single FM and the synthetic FM have identical switching delays and switching thresholds since the constituent layers have identical material parameters. With sufficient exchange coupling strength, a SAFM behaves essentially as a single FM. The striking result, shown in the figure, is that the inverse switching delay increases at a much faster rate for the synthetic anti-ferromagnetic (SAFM) configuration as the spin current is increased. In addition, the rate of increase strongly depends on the relative thickness of the constituent layers.

This result may be obtained from numerical simulations based on coupled Landau-Lifshitz-Gilbert (LLG) equations, and it can be understood from an angular momentum conservation analysis that requires that the minimum current-delay product to be limited by the net number, N, of Bohr magnetons comprising the structure. A bilayer with $N_{1,2}=(M_s V)_{1,2}$ Bohr magnetons in layers 1 and 2, has a total of $(N_1+N_2)$ for FM coupling, and $(N_1-N_2)$ for SAFM coupling. Consequently the slope of the inverse switching delay versus normalized current in FIG. 2 equals $(N_1+N_2)^{-1}$ for FM coupled layers and is larger, $(N_1-N_2)^{-1}$, for SAFM coupled nanomagnets.

Figure 2A:
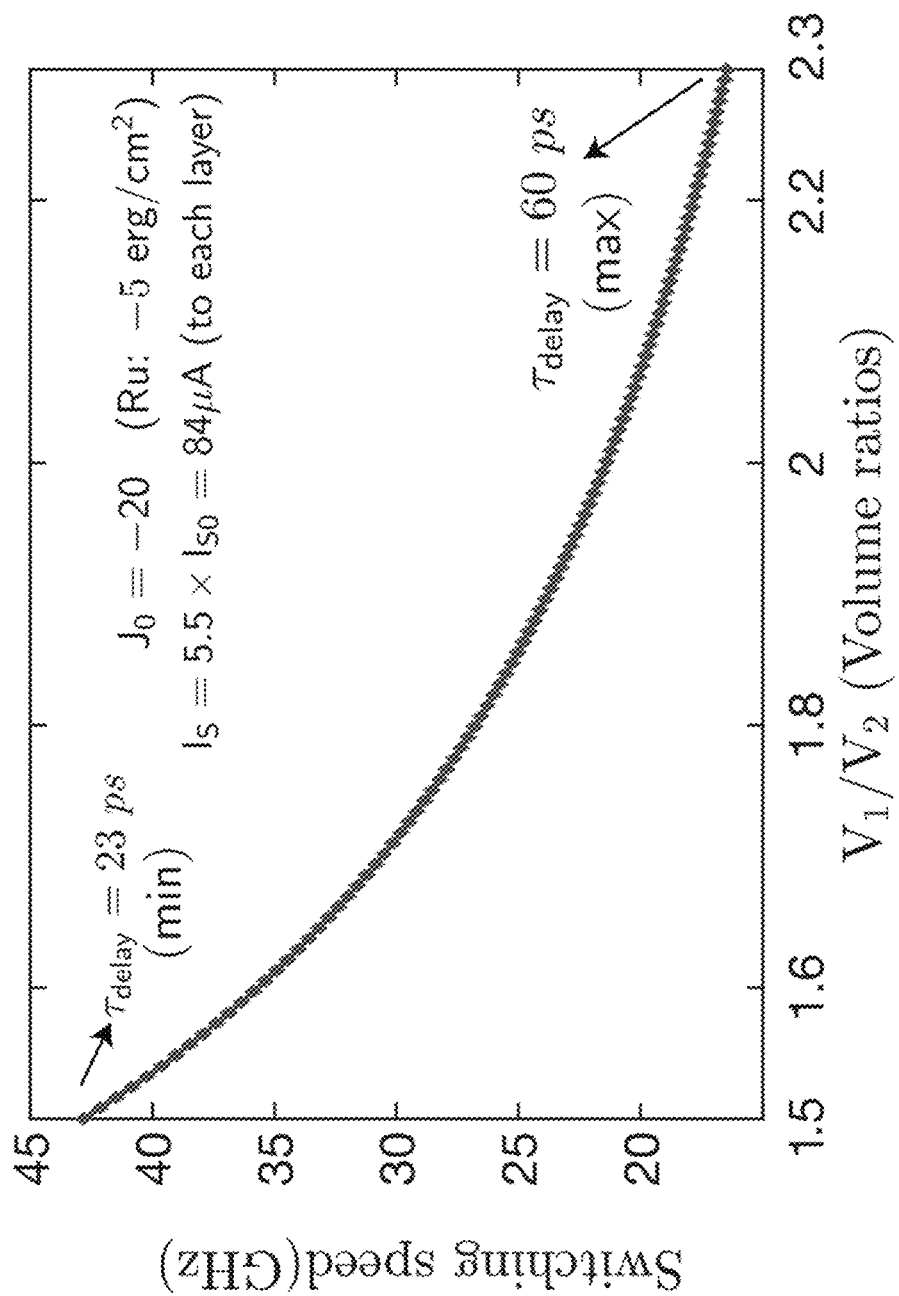

Note that the layers of the bilayer structure of FIG. 2 are chosen to have the same anisotropy field $H_K$, and magnetization per unit volume, $M_S$. The difference in $N_1$ and $N_2$ arises simply from the difference in thickness or volume of the two layers. This simple requirement is of significant practical importance, as it allows the synthetic anti-ferromagnets to be fabricated using the same magnetic material. There is no restriction on the magnitude of the material's magnetic anisotropy, except that low I-Ix materials need to have higher values of $N_{1,2}$ to ensure thermal stability, thereby resulting in worse current-delay products. For SAFM-coupled bilayers, $(N_1-N_2)$ can be made very small, even if $N_{1,2}$ are individually large. In principle $(N_1-N_2)$ can be made arbitrarily small, however this requires very large exchange coupling energies $J_{ex}$. This requirement places a practical limit on how small $(N_1-N_2)$ can be made. In certain embodiments, the ratio of the volumes $V_1$ to $V_2$ is less than 2.3. In other embodiments, the ratio of the volumes $V_1$ to $V_2$ is less than 1.5. In still further embodiments, the ratio of the volumes $V_1$ to $V_2$ is less than 1.33. In embodiments where the upper and lower layers have equal cross-sectional areas (e.g., cylinders of equal diameter), the above ratios would apply to the thicknesses of the layers. Given the importance of the volume ratio of the volumes $V_1$ and $V_2$, relationships shown in FIG. 2 has been shown as a function of switching speed vs. volume ratio ($V_1/V_2$) for volumes ($V_1$, and $V_2$) of cobalt and Ru as the exchange coupling layer (ECL) normalized with respect to a threshold injected spin current. It can be seen from FIG. 2a that for a volume ratio range of 1.5 to 2.3 a switching speed range of 23 ps to 60 ps is achieved, respectively It should be noted that the disclosed system of building synthetic ferrimagnets out of identical magnetic materials is very different from the well-established principle of coupling low to high magnetic anisotropy materials which are known to reduce the critical current, but at the expense of switching time delay because it increases $N_{1,2}$ relative to the high anisotropy layer. The presently disclosed system, by contrast, leads to a slight increase in the critical current, but for a given current provides a striking reduction in delay.

The magnetic layers of a synthetic anti-ferromagnet may be described by a macrospin model in the monodomain approximation, and that the mean-field approximation describes the exchange interaction between layers 1 and 2. The coupled LLG equation that is the basis of all results in this paper is given by:

$$(1+\alpha^2)\frac{d\hat{m}_i}{dt} = -|\gamma|\hat{m}_i \times \vec{H}_i - \alpha|\gamma|(\hat{m}_i \times \hat{m}_i \times \vec{H}_i) + \frac{1}{qN_i}(\hat{m}_i \times \vec{I}_{Si} \times \hat{m}_i) + \left(\frac{\alpha}{qN_i}(\hat{m}_i \times \vec{I}_{Si})\right) \quad (1)$$

where i stands for magnets 1, 2 respectively. Each magnet is assumed to have perpendicular magnetic anisotropy (PMA), therefore the effective field, including the mean-field exchange component, can be written as $\vec{H}=H_K m_{zi}\hat{z}+J_{ez}(S_i+S_j)/(M_s V)_i \hat{m}_j$ where I, j$\in\{1,2\}$, i$\neq$j, $N_i=(M_s V)i/\mu_B$, and $\mu_B$ is the Bohr magneton. We define $H_K$ as the effective perpendicular anisotropy that is the net difference between the surface and shape anisotrophy, i.e.

$H_K=H_K^{nfl}=H_K^s-4\pi M_s$ herein. $S_{ij}$ is the surface area of the layers. The spin current inputs $\vec{I}_{Si}$ are applied along the +z direction, are assumed to be of equal magnitude and are present throughout the entire magnetization reversal time. This is referred to herein as static current switching in contrast to pulsed current switching. Numerical parameters used for the results of FIG. 2 are: $H_K$=5000 Oe, $M_s$=1000 cmu/cc, PMA diameter $\Phi$=36 nm, damping coefficient $\alpha$=0.01 and t1+t2=1 nm. The thermal stability for the system is $\Delta$=60 kT assuming that it is given by the sum of the thermal stability of the constituent layers. A value of $J_{ex}$=±5 erg/cm2, is chosen, as measured experimentally in Co/Ru/Co multilayers. The x-axis in FIG. 2 is normalized to $I_{sc}$=4 q/h $\alpha$ ($\Delta$) the critical switching current required for the single FM layer, and is equal to $I_{s0}\approx$15.4 µA. For the chosen PMA diameter ($\Phi$=36 nm), this corresponds to a critical current density of $J_c\approx2\times10^5$ A/cm$^2$.

Figure 3A:
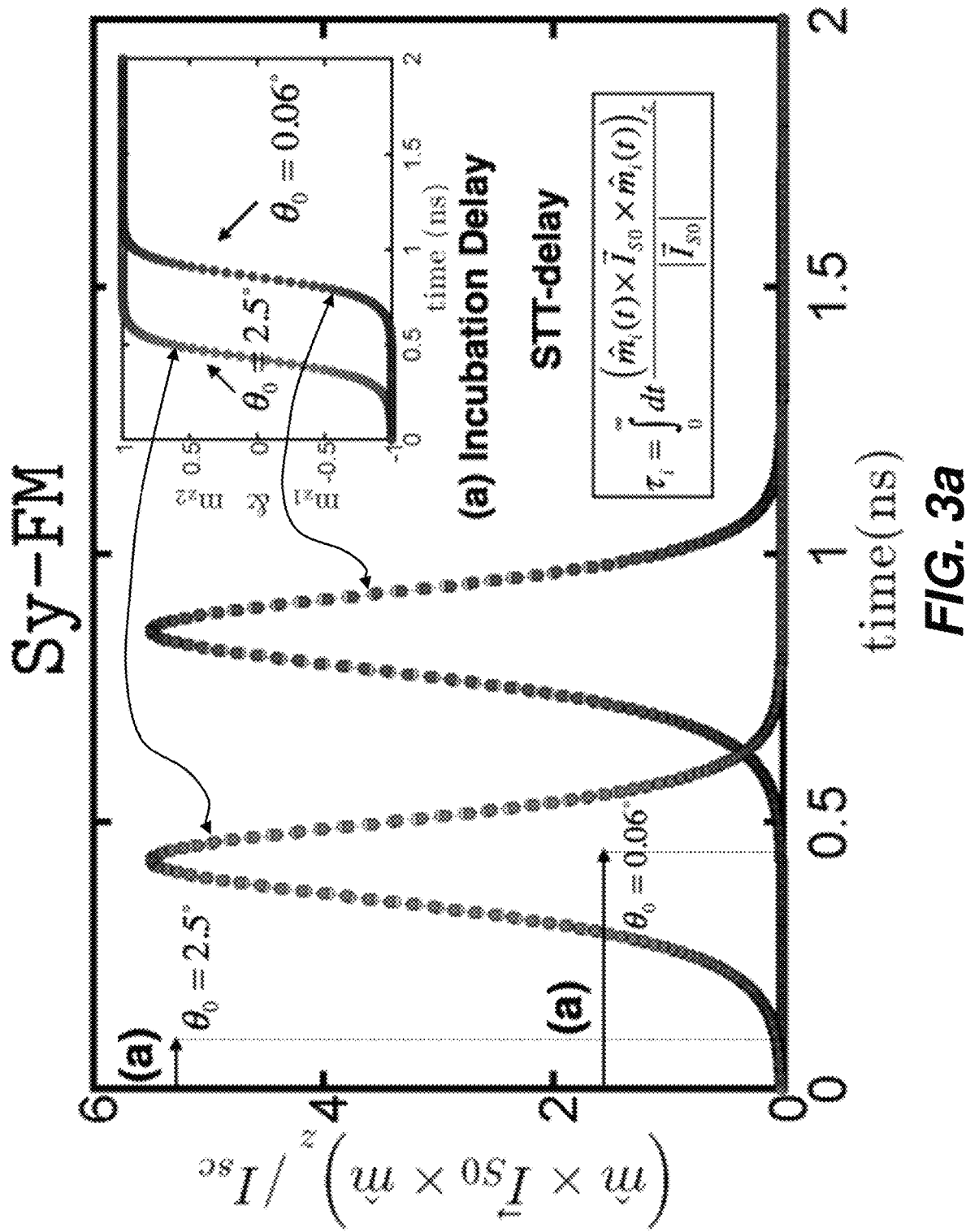
FIG. 3a is a graph illustrating the z-component of spin-torque currents of both layers of a synthetic ferromagnet.
Figure 3B:
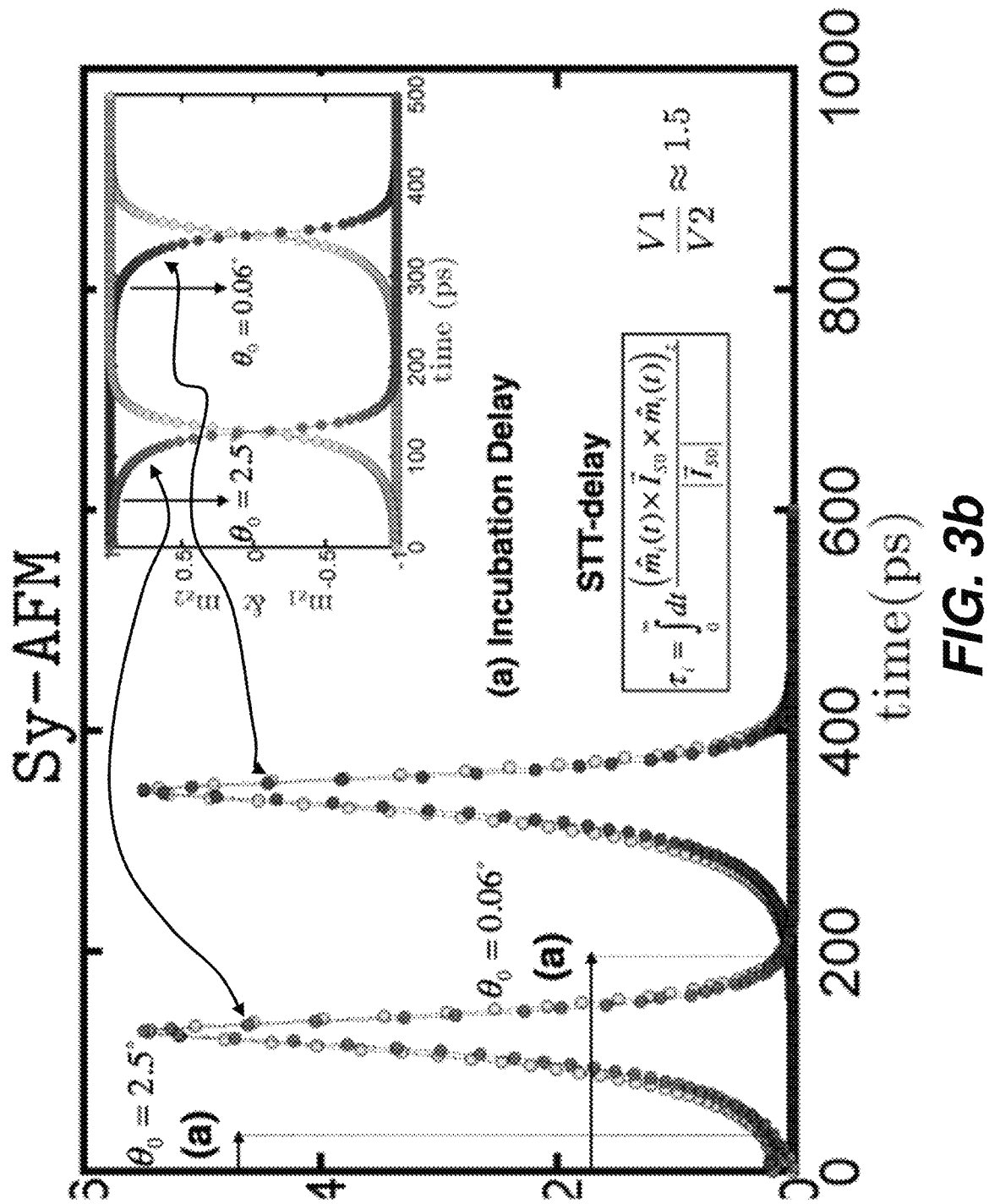
FIG. 3b is a graph illustrating the z-component of spin-torque currents of both layers of a synthetic anti-ferromagnet.

Magnetization delay is a strong function of the initial angle of the magnets and in tilted media magnetic layers are engineered to have built-in initial angles to increase their switching speed. We define delay in terms of angular momentum transfer that is independent of the chosen initial angle as shown in FIG. 3. The switching delay for a given layer $t_i$ is the ratio of deposited charge (Q) to the spin-current input ($|\vec{I}_{S0}|$) applied to that layer:

$$\tau_i = \frac{Q}{|\vec{I}_{S0}|} = \int_0^\infty dt \frac{(\hat{m}_i(t)\times \vec{I}_{S0} \times \hat{m}_i(t))_z}{|\vec{I}_{S0}|} \quad (2)$$

The integrand in Eq. (2), the z-component of the spin-torque current, is shown as a function of time during switching in FIG. 3 for synthetic FM and AFM layers. The integral is simply the area under the spin-torque current and is approximately zero throughout the incubation delay; thereby making the delay independent of the chosen initial angle.

In the near to high overdrive current regimes, the area under the spin-torque current (summed for layer 1 and layer 2) yields exactly the net number of magnetic moments in the bilayer, which is $2(N_1+N_2)$ for synthetic (and single) ferromagnets and $2(N_1-N_2)$ for synthetic anti-ferromagnets. The integrand of Eq. (2) is exactly equal to 2N for single (PMA) magnets, however this is strictly true only in the high-overdrive regime (See Appendix A). As the overdrive is increased, the time-integral of Eq. (2) behaves as a Gaussian: increasing in maximum amplitude, but becoming narrower in order to keep the area underneath constant, a manifestation of angular momentum conservation. Therefore, when delay is defined as in Eq. (2), the inverse delay becomes exactly proportional to the net number of spins in the system as shown by the dashed lines in FIG. 2.

Consider next the figure of merit, E×$\tau$, namely the product of the switching energy and the switching delay: This metric can equivalently be expressed by the static parameters of the total deposited charge over a given resistance, i.e E×$\tau$=Q$^2$R ($\tau_{sw}/\tau_{pw}$), where Q is the charge deposited into the system and R is the net resistance that the injected current experiences, $\tau_{sw}$ and $\tau_{pw}$ are the switching delay of the magnetization reversal and the pulse duration of the applied spin-current respectively. In the present disclosure, most of the results presented are for $\tau_{sw}=\tau_{pw}$ since the spin-currents are assumed to be on during the entire magnetization reversal time. Therefore, the net charge (Q) required for switching is reduced, improving the energy-delay requirements for the nanomagnets significantly.

One of the non-intuitive aspects of the synthetic anti-ferromagnetic free layer of the present disclosure, is the requirement of symmetrically spin-polarized currents to be applied to both layers as shown in FIG. 1a, which is counter-intuitive for the SAFM configuration. If the exchange interaction was weak, we would naturally expect to apply anti-symmetrically polarized spin-currents to the layers to switch their orientation. However, in the case of rigid coupling, anti-symmetrically polarized currents are much less efficient than symmetrically polarized currents as shown in FIG. 4. This is also reflected in the analytical switching thresholds derived below.

Figure 4A:
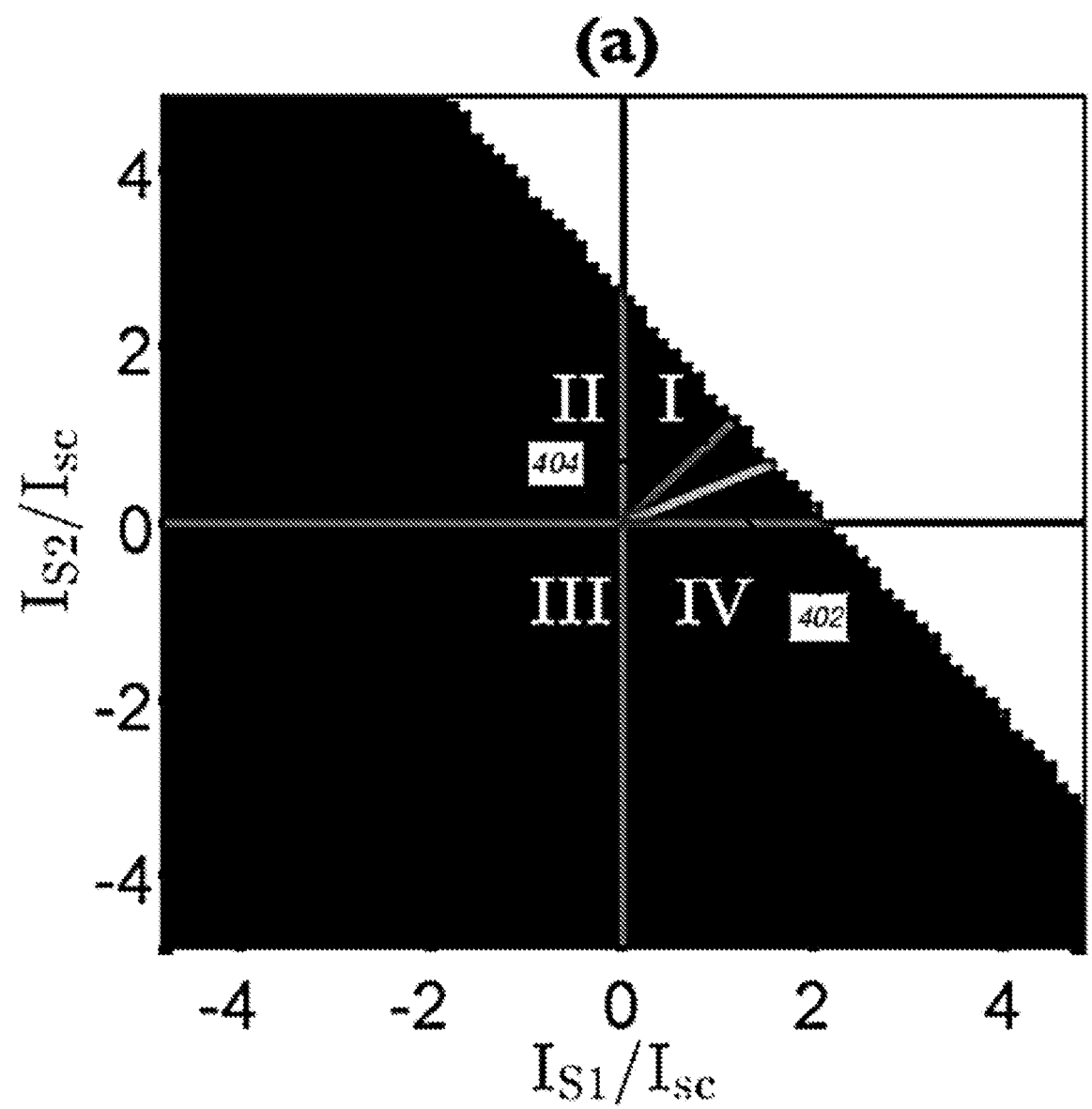
FIG. 4a is a plot showing four quadrants for combinations of spin currents.
Figure 4B:
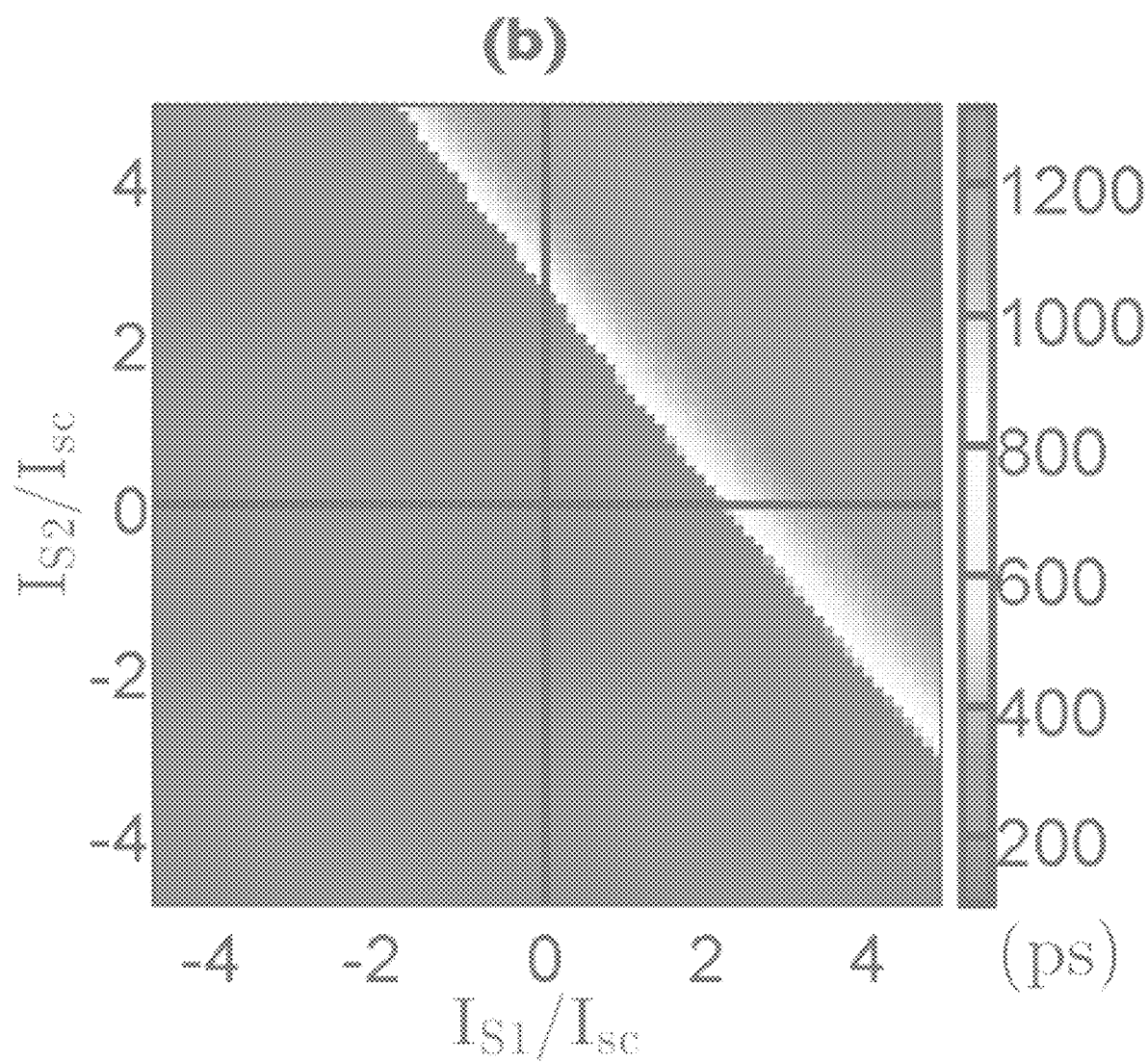
FIG. 4b is a phase plot showing switching delays.

The optimum current configuration is when the spin-current polarization applied to the thicker layer ($t_1>t_2$) is in the "correct" direction for switching, i.e in the anti-parallel direction to its original direction while the spin-current applied to layer 2 is in the "wrong" direction, i.e. aligned parallel to its own magnetization, which would normally not cause switching if the layers were decoupled ($J_{ex}$=0). FIG. 4a provides a plot showing four quadrants for combinations of spin-currents $I_{S1}$ and $I_{S2}$ that are applied along the z-axis of the AFM coupled magnetic layers, showing the first quadrant (I) to be the optimum region. The initial condition in all cases is assumed to be (−1, 1). The black regions correspond to no switching ($mz_1$=−1) ($mz_2$=+1) and the white region corresponds to switching ($mz_1$=+1, $mz_2$=−1). The line 402 indicates the minimum amount of dimensionless spin current: Equal for both layer 1 and layer 2, such that $\vec{I}_{S1}/(\gamma N_1)=\vec{I}_{S2}/(\gamma q N_F)=I_0 z$, for this example $V_2=V_1=3/7$. The line 401 is obtained by assuming that the total sum of applied spin current is invariant for rigid coupling ($J_{ex}$=−5 erg/cm2). FIG. 4b shows a phase plot for switching delay based on Eq. (2), scaled to picoseconds, with the region to the upper right having a switching below 200 picoseconds, and the region to the lower left having very high switching delay (above 1200 picoseconds) or no switching.

Analytical formulas for critical switching threshold (the x-intercepts in FIG. 2) may be derived by linearizing the LLG equation around the fixed points of the dynamic AFM and FM systems for various limits (See Appendix A for detailed derivations). The FM bilayers are addressed first. Analytical work for exchange coupled in-plane magnets (IMA) has been conducted by others for bilayers that are driven by a single spin-current source [27-30]. The present disclosure analysis is different from prior art methods in at least two ways: (a) the present disclosure focuses on synthetic bilayers driven by two distinct spin-currents, symmetric or anti-symmetric in spin-polarization direction; and (b) the present disclosure focuses on identical PMA materials with the only asymmetry being their difference in thickness or volume.

For strongly exchange coupled FM-bilayers having equal $K_u$ and $\alpha$ and $M_S$ parameters and differing only by volume, the sum of the critical switching currents can be shown to be equal to the sum of spin-torque switching currents of the individual (decoupled) magnets.

$$I_{Si}^c = \frac{2q}{\hbar}\alpha(K_i V_i) \quad (3)$$

where i$\in$\{1, 2\} and $I_{S1}$, $I_{S2}$ are the minimum spin currents applied to layers 1 and 2 respectively. We derive this result by a Jacobian analysis assuming equal dimensionless spin-currents being applied to the individual layers i.e, $I_{S1}/qN_1=I_{S2}/qN_2$ and find that this result is independent of the exchange strength $J_{ex}$ (See Appendix A). However, numerical simulations suggest that as long as the total spin-current given by $I_{S1}{}^c+I_{S2}{}^c$ in Eq. (3) is split in half and applied equally to each layer ($I_{S1,2}=I_{S0}=(I_{S1}{}^c+I_{S2}{}^c)/2$), the magnets switch without requiring equal dimensionless current. Eq. (3) is intuitive since one would expect a rigidly coupled synthetic-FM to behave like a single FM with an effective total $K_u V$.

Next, we consider a synthetic anti-ferromagnet comprising two FM layers anti-ferromagnetically coupled and having unequal thicknesses or volumes ($V_1 > V_2$) which are driven by symmetrically polarized spin-currents, all magnetic layer parameters are assumed to be equal otherwise. The derivation for this case also assumes equal dimensionless spin-currents applied to both layers, however as the phase plot in FIG. 4 shows for strongly exchange coupled AFM structures, the total current required to switch the synthetic anti-ferromagnet does not depend on the individual proportion of the injected spin-currents, $I_{S1}$ and $I_{S2}$. It can be observed from the phase plot that the bilayer can be switched as long as the sum of $I_{S1}$ and $I_{S2}$ equal a constant value. The critical spin current that needs to be applied to layer 2 is $$I_{S2}^c = \frac{(\beta-1)I_{ex}}{2} + \sqrt{I_c(I_c + I_{ex}(\beta+1)) + \frac{I_{ex}^2}{4}(\beta-1)^2} \quad (4)$$

where $\beta = V_2/V_1 \leq 1$ and $I_c$ and $I_{ex}$ are defined as:

$$I_{ex} = \frac{2q}{\hbar}\alpha(|J_{ex}|S) \quad (5)$$

$$I_c = \frac{2q}{\hbar}\alpha(2K_2 V_2) \quad (6)$$

The current that needs to be applied to layer $V_1$, assuming an equal dimensionless spin-current ($I_{S1}=qN_1=I_{S2}=qN_2$), is $I_{S1}{}^c=I_{S2}{}^c/\beta$. This result is exact and works for all values of $J_{ex}$ from weak to strong exchange coupling. We have, however, confirmed by numerical simulations that for strong coupling, the total spin-current is given approximately by the sum of $I_{S1}{}^c+I_{S2}{}^c$, as shown in FIG. 4). Then, for the case of a symmetric structure in which equal total currents are provided to both layers, the minimum input currents become $I_{S1}=I_{S2}\approx I_{S2}{}^c(1+1/\beta)/2$. The red line 402 in FIG. 4 shows the analytical threshold which yields a higher layer 1 current since $N_1 > N_2$ for equal dimensionless currents, and the blue line 404 is obtained by halving the total spin-current necessary.

Note that the equal volume case ($\beta=1$) imposes an upper limit to the threshold current:

$$\lim_{\beta \to 1} I_{S0}^c = \sqrt{(I_c^2 + 2I_c I_{ex})} \quad \text{(symmetrically driven)} \quad (7)$$

where $I_0{}^c$ is the spin-current applied to both layers, since layer 1 and 2 are identical in this limit. Eq. (7) shows that even when the exchange interaction is large compared to the uniaxial anisotropy constant ($I_{ex} \gg I_c$), the critical current ($I_{S0}{}^c \approx \sqrt{2I_c I_{ex}}$) does not diverge, on account of the square root dependence. This is in sharp contrast with the case where anti-symmetrically polarized spin currents are applied to the layers of the AFM, i.e. $I_{S2}=-I_{S1}$. In this case, we show that the critical current that needs to be applied to both layers to create an instability off the equilibrium points is (assuming $\beta=1$):

$$I_{S0}^c = (I_{ex} + I_c) \quad \text{(anti-symetrically driven)} \quad (8)$$

where $I_{ex}$ and $I_c$ are given by Eq. (5) and Eq. (6) respectively. Eq. (8) shows that in the case of anti-symmetric currents, the deviation threshold grows linearly as a function of the exchange interaction, $J_{ex}$, and therefore it becomes large when compared to Eq. (7). This behavior is also confirmed by the phase plot shown in FIG. 4, in which the IV quadrant corresponds to the bilayer being driven by anti-symmetrically polarized spin currents.

Figure 5A:
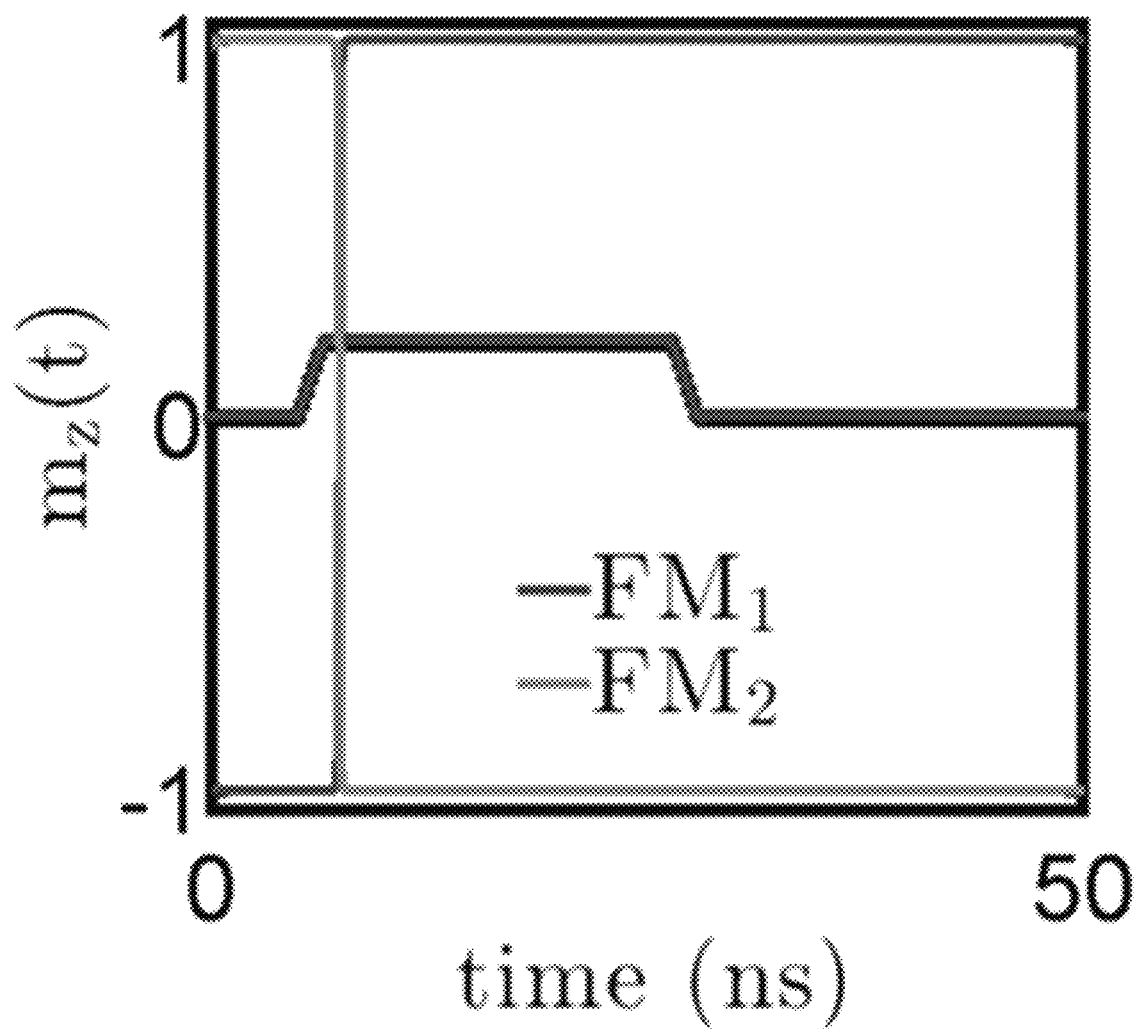
FIG. 5a is plot showing the response of a layer magnetization as a function of time upon applying a rectangular pulse, where exchange layer coupling is very high.
Figure 5B:
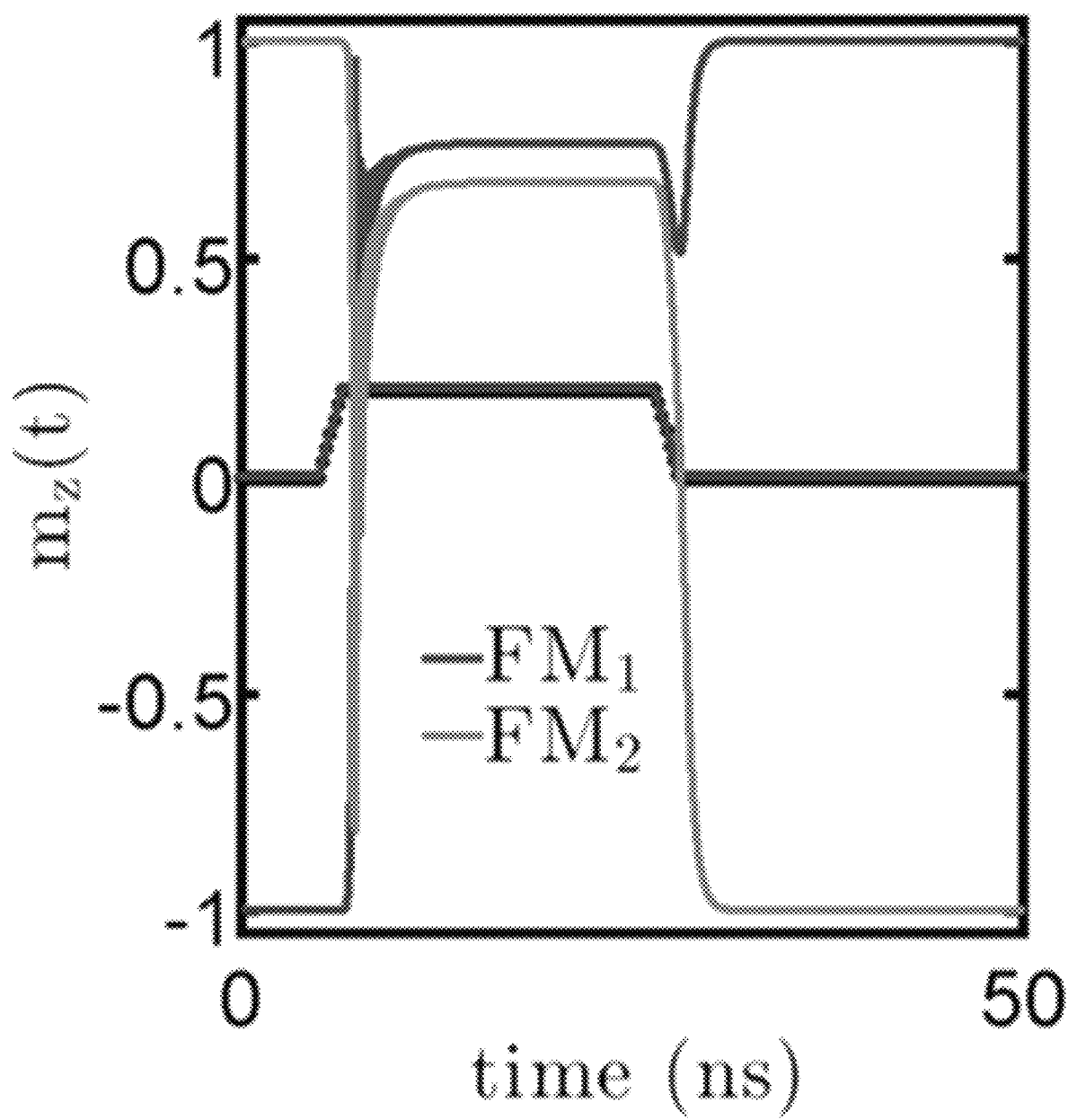
FIG. 5b is plot showing the response of a layer magnetization as a function of time upon applying a rectangular pulse, where exchange layer coupling is moderately strong.
Figure 5C:
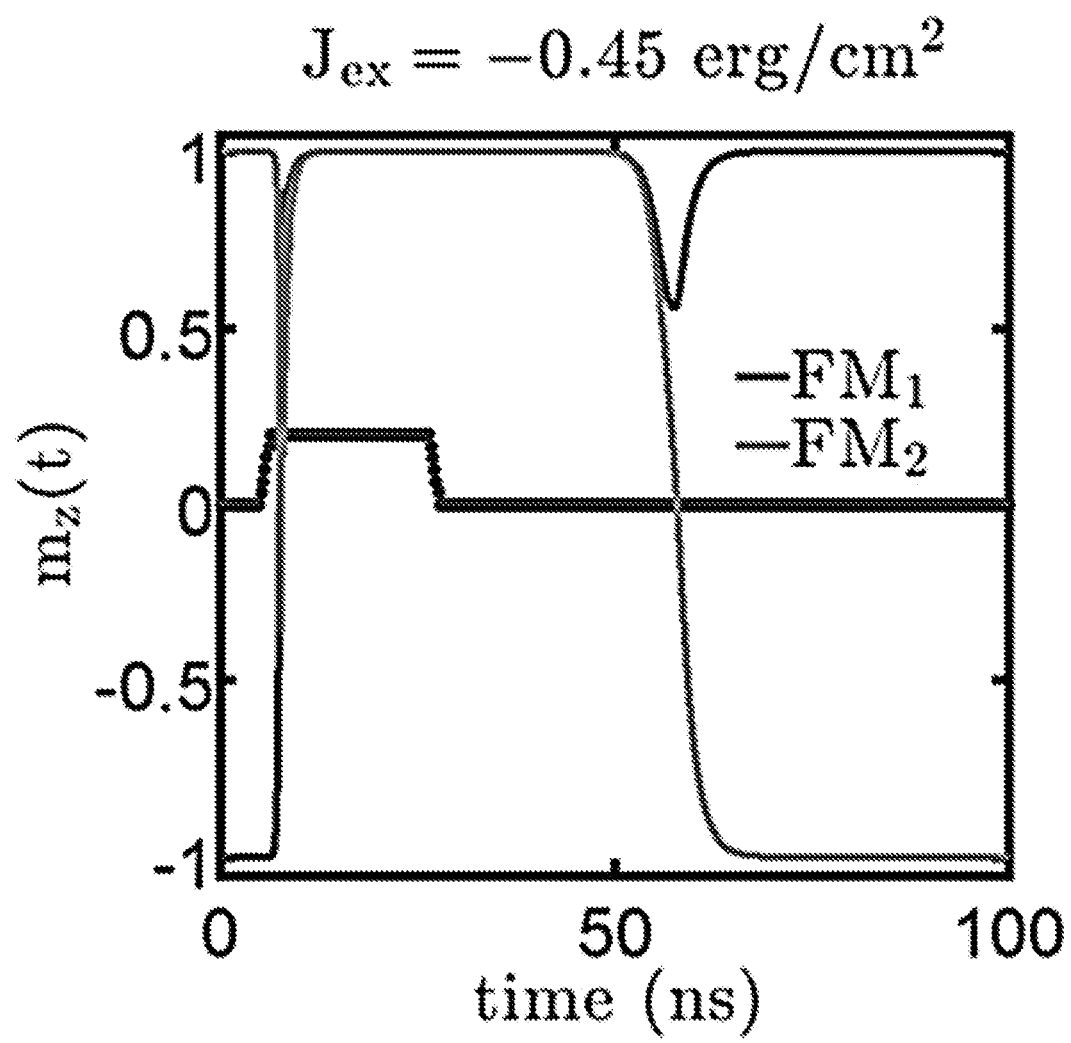
FIG. 5c is plot showing the response of a layer magnetization as a function of time upon applying a rectangular pulse, where exchange layer coupling is moderately weak.
Figure 5D:
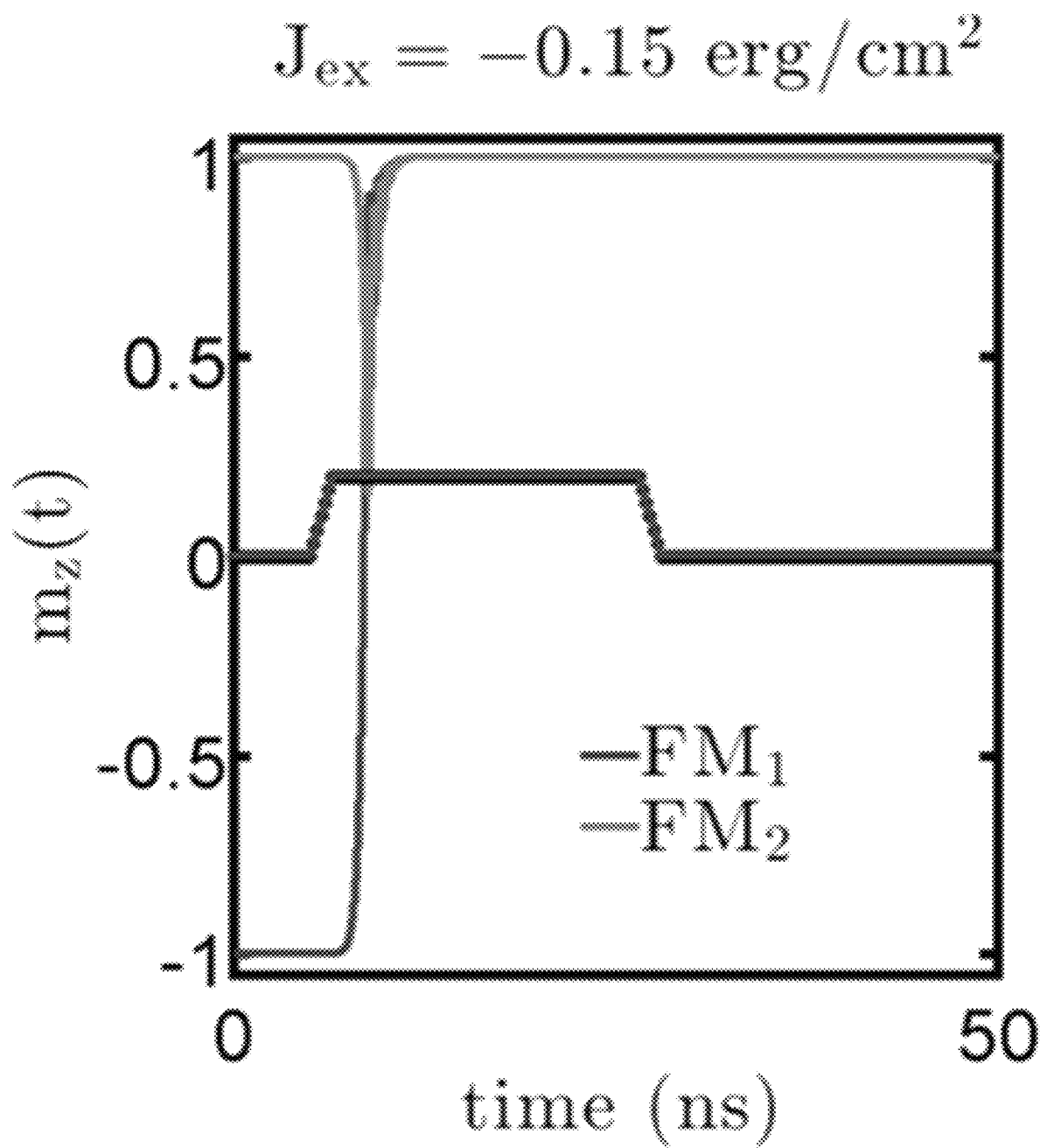
FIG. 5d is plot showing the response of a layer magnetization as a function of time upon applying a rectangular pulse, where exchange layer coupling is very weak.

The fact that we apply a constant spin-current to the thinner layer in the direction to pin this layer in its initial state might cause switching errors if the exchange interaction is not strong enough. In FIGS. 5a-5d show the response of the layers' magnetization as a function of time upon applying a rectangular current pulse. FIG. 5a shows the case for strong coupling ($J_{ex}=-5$ erg/cm$^2$) in which the switching behavior does not depend on the duration of the pulse, as the exchange interaction is strong enough to keep the individual layers anti-parallel at all times. Upon the spin-currents attaining their peak value, the magnets switch and remain in their switched configuration. FIG. 5b shows an example of moderate coupling ($J_{ex}=-1.5$ erg/cm$^2$). In this case, since the applied current is much larger than the individual critical current of the thinner layer, the system reaches a meta-stable state as long as the pulse is on, but when the pulse is turned off, the layers ultimately go to a (−1, +1) state starting from a (+1, −1) state, completing the correct reversal. FIG. 5c shows the case for weak coupling ($J_{ex}=-0.45$ erg/cm$^2$), the thicker layer switches once the peak value of the current pulse is attained. However, the thinner layer 2, remains pinned in its original direction due to the parallel orientation of the spin-current with the initial direction of its magnetization. After the pulse is turned off, the anti-ferromagnetic exchange interaction is strong enough to keep the layers in an anti-parallel state. This example shows that even for weak coupling, short pulses can be used to switch the magnets correctly as long as the exchange interaction is strong enough to force an AFM configuration in equilibrium. The final example, FIG. 5d shows how in the case of very weak coupling ($J_{ex}=-0.15$ erg/cm$^2$) a switching failure ensues. The switching of the thicker layer completes at the peak of the current pulse, and remains switched long after the current pulse is turned off. However, the exchange interaction is not strong enough to force an AFM configuration.

Figure 6:
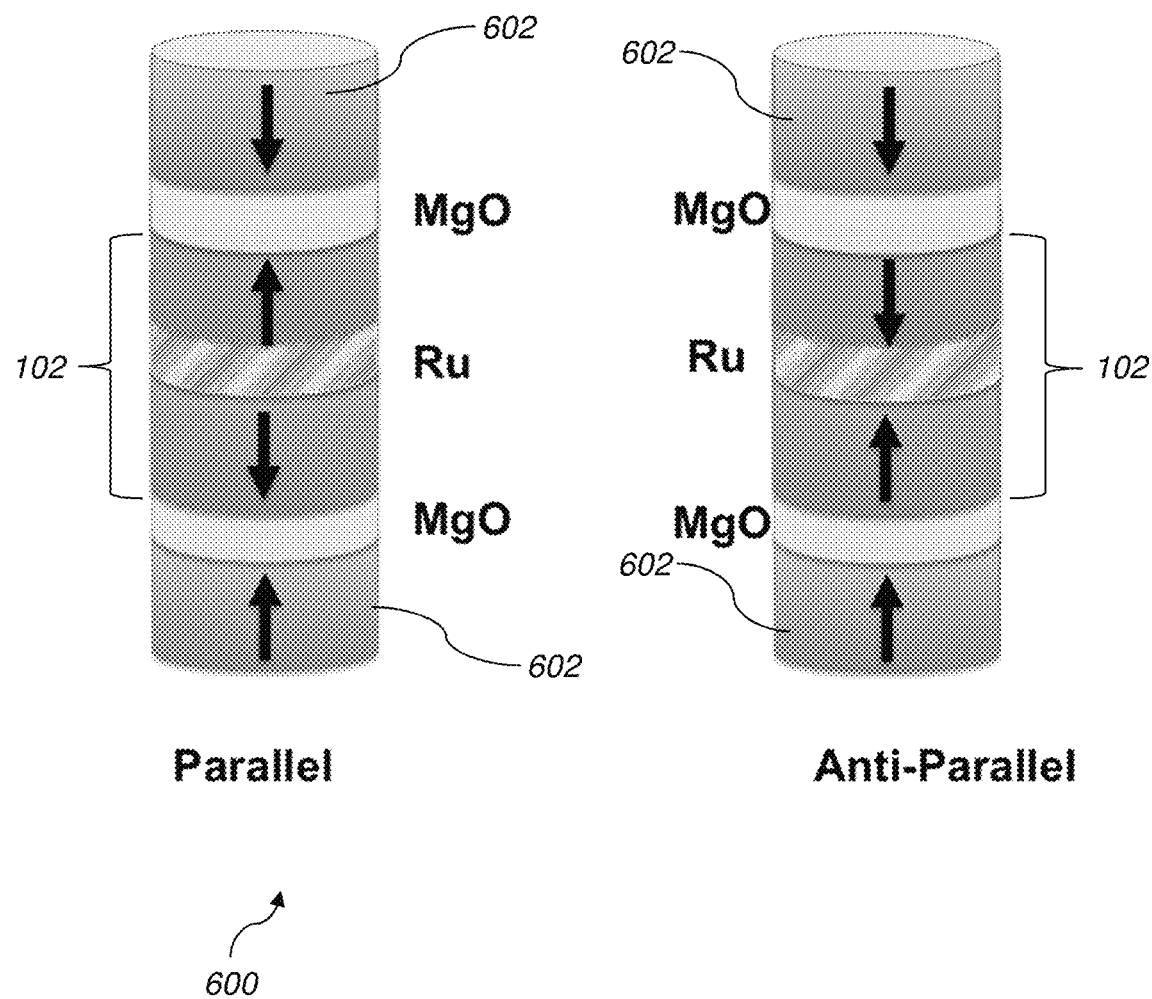
FIG. 6 shows an example implementation of a synthetic anti-ferromagnetic device according to one embodiment.

Therefore at sufficiently high exchange coupling energies between the layers and using short current pulses, even faster switching times may be obtained as $\beta \to 1$ as shown in FIG. 2. FIG. 5 therefore shows that the symmetrically polarized spin-current reversal mechanism of the present disclosure works even when the exchange interaction is in the moderate-to-weak regime and successful reversals can be achieved utilizing short current pulses FIG. 6 shows an example implementation of a synthetic anti-ferromagnet device 600 according to one embodiment of the present disclosure. The efficiency of the switching mechanism increases when two distinct spin-currents are applied. The spin-currents shown by the arrows in FIG. 6 may be supplied from other spin-current sources, such as the Giant Spin Hall Effect (GSHE) in a 3-terminal device configuration. To generate independent spin-current inputs in the same direction, the architecture shown in FIG. 6 which employs two reference polarizer layers 602 aligned in anti-parallel directions may be provided.

Synthetic antiferromagnets, such as those provided in magnetic tunnel junctions (MTJs) often employ Ru as an exchange coupling interlayer (as shown in FIG. 6 whose thickness is adjusted to achieve the desired level of exchange strength between the layers. In the illustrated embodiment it is assumed that the magnetic layers are effectively driven by independent spin-currents disregarding the transport effects throughout the structure. This would be an accurate assumption if Ru acted as an ideal spin-sink, however, Ru has a spin-flip length of $\lambda_{sf} \approx 14$ nm, which is much longer than the typical spacer thicknesses (which may be in the range of $t_{Ru} \approx 0.3$-$0.6$ nm), and may not be an ideal spin-sink. In that case a detailed transport model may be needed.

Structures similar to the one shown in FIG. 6 have been shown to exhibit TMR values comparable to standard MTJs. Note that in the present disclosure, this is due to the counter-intuitive necessity of requiring symmetric spin-currents to be applied to both magnetic layers.

One of the critical design parameters for STT-MTJ devices is the need to restrict the injected charge current density to magnitudes below the dielectric breakdown of the MgO tunnel barrier layer. Whereas different values for the voltage breakdown for nanoscale MgO layers have been investigated, there is general consensus in the art that the breakdown voltage is around $\approx 0.4$V. The current densities required to switch the synthetic anti-ferromagnet disclosed herein are shown to be below this MgO breakdown constraint. Consider MTJ cylindrical stacks (such as those shown in FIG. 6) of $\Phi=36$ nm in diameter comprising PMA magnets having effective magnetic anisotropies of $H_K=5000$ Oe and the magnetic properties employed for the results of FIG. 2. Assuming an RA-product of $4\Omega$-$\mu m^2$ and a 400 mV breakdown voltage, the breakdown current becomes 100 µA. Assuming a polarization factor of $P \approx 0.5$, it is observed that the overdrive currents employed in FIG. 2 are below the current breakdown limit for MgO.

As shown in FIG. 2, the switching speed of synthetic anti-ferromagnets is ultimately determined by the net number of spins in the system. This means that the employment of very high HK magnets is not a necessary condition for exploiting their benefits, provided that the bilayers are strongly exchange coupled. For example if low $H_K^{eff}=100$ Oe PMA magnets are chosen, to meet a $\Delta=60$ kT thermal stability criterion, the pillar diameter and the layer thicknesses need to be increased to ($\Phi=100$ nm) and ($t_1=4$ nm and $t_2=3$ nm) respectively. Numerical simulations estimate that for an approximately 0.3 mA spin-current applied to both layers (well below the breakdown requirements in this larger area), sub-nanosecond switching delays are attainable even with such a low $H_K^{eff}$.

Next we consider a MTJ nano-pillar dimension of $\Phi=20$ nm for a storage density of $\approx 1$Tb/in$^2$. The thickness of the AFM coupled layers is selected to be $t_1=4$ nm and $t_2=3$ nm. The use of thicker PMA magnets allows precise thickness control, facilitating fabrication and reliability of devices approaching the equal thickness regime. The following magnetic parameters for both layers are chosen in our estimate to provide a bilayer thermal stability of $\Delta=55$ kT, $M_s=210$ emu/cc with $H_K=1$ T with $\alpha=0.01$, for both layers. For this example, a rigidly coupled AFM system requires $N_{net}=N_1-N_2 \approx 3500 \mu_B$. Using a static spin current of 100 µA, numerical simulations show that a delay that is of the order of picoseconds $\approx 12.8$ ps (calculated from Eq. (2)) is attainable, provided that the exchange interaction between the layers is around ($J_{ex}=-40$ erg/cm$^2$).

Figure 7A:
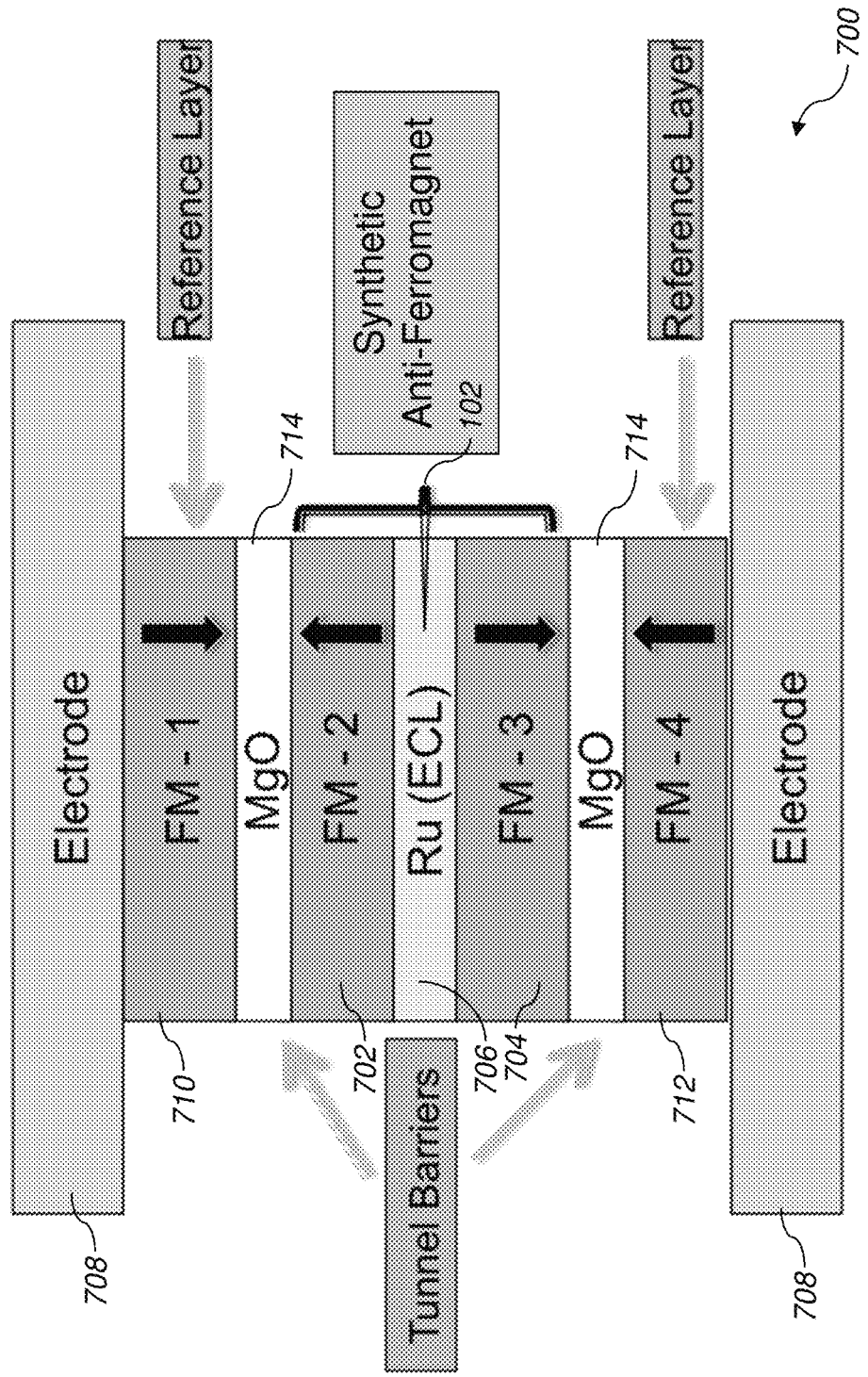
FIG. 7a shows a spintransfer-torque magnetic tunnel junction according to one embodiment.

FIG. 7a shows one embodiment of a spintransfer-torque (STT) magnetic tunnel junction (MTJ) 700 employing the synthetic anti-ferromagnet (SAFM) 102 of the present disclosure. The synthetic anti-ferromagnet 102 shown in the FIG. 7a comprises two ferromagnetic layers 702 (FM-2) and 704 (FM-3), which are antiferromagnetically coupled (indicated by the opposing magnetization direction arrows) via an exchange coupling layer 706 (ECL). The thickness and material properties of the ECL control the strength of the AFM interaction between the layers. Ru as an ECL material is shown in the figure, although this is not intended to be restrictive and other materials such as Ru-alloys or superparamagnetic materials can also be employed to optimize the magnetic properties of the SAFM. Independent driving currents shown by the arrows are injected via the electrodes 708 shown in the figure into reference layers 710 (FM-1) and 712 (FM-4), also referred to herein as polarizer layers. Tunnel barrier layers 714 separate the layers 702 and 710, and layers 704 and 712 as shown. From prior art teachings related to spin-torque driven magnetic devices, one might expect that in FIG. 7a, FM-1 and FM-4 should be prepared in their parallel configuration resulting in anti-symmetrically polarized spin currents injected into the SAFM. As discussed above, however, the advantages of the present disclosure are best realized when the two spin-currents are polarized in symmetric orientation. This is achieved by orienting the magnetization of the reference layers, FM-1 and FM-4, in an antiparallel configuration.

Figure 7B:
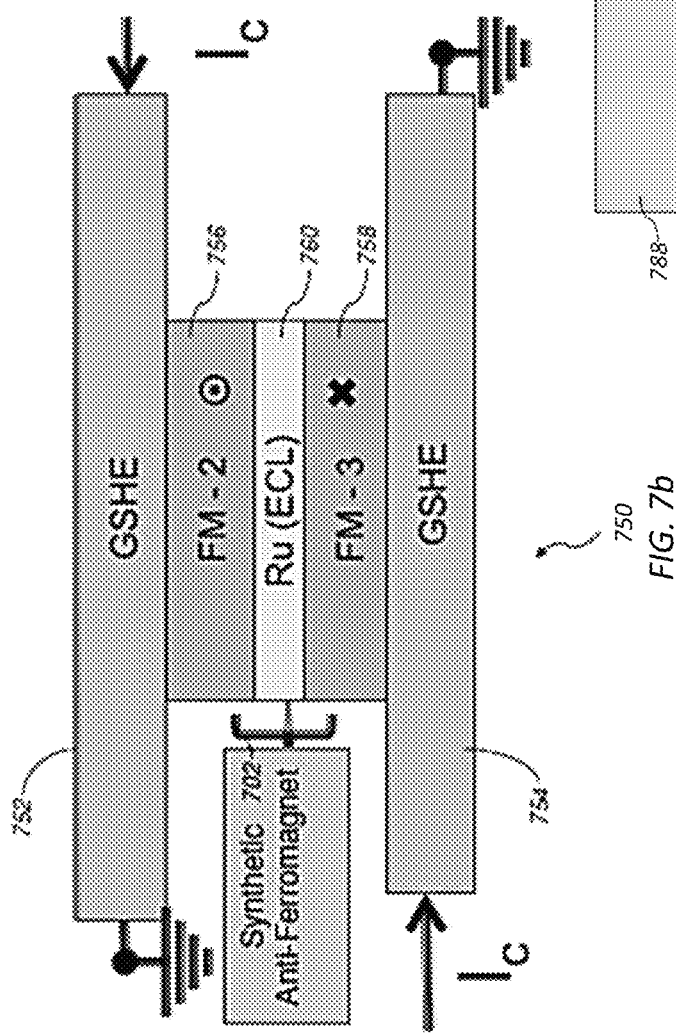
FIGS. 7b and 7c shows further embodiments, where charge currents are injected through GSHE layers according to one embodiment (FIG. 7b), and another spintransfer-torque magnetic tunnel junction, according to another embodiment (FIG. 7c).
Figure 7C:
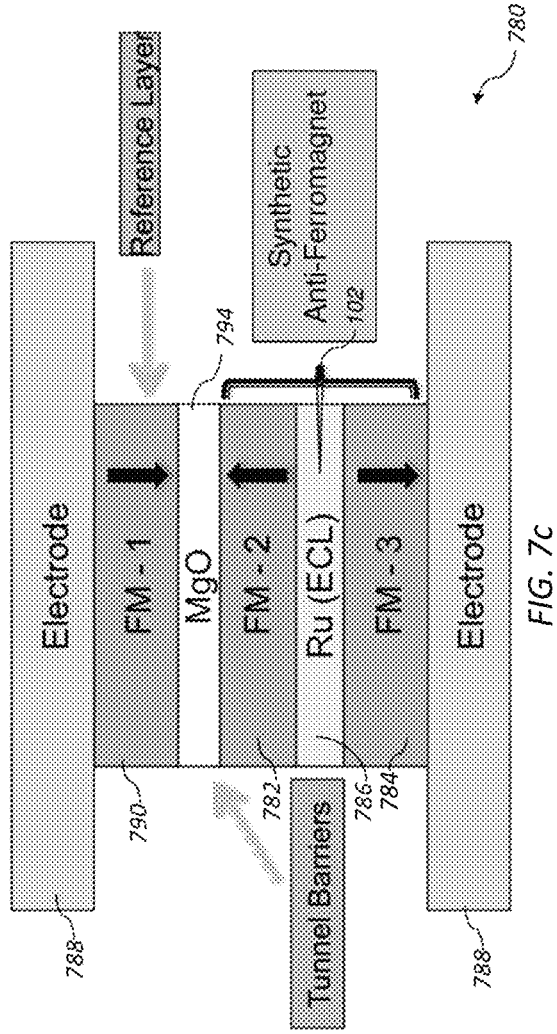

FIG. 7b shows a further embodiment of an antiferromagnet structure 750, according to the present disclosure, where charge currents (shown as IC) are independently injected through the giant spin hall effect (GSHE) layers 752 and 754. The layers 756, 758 and 760 are similar to the layers 702, 704 and 706 of FIG. 7a, respectively. The layers 752 and 754 comprise a material such as β-Tantalum or other materials having large spin-orbit coupling interactions. Charge current flow in these materials generates spin-currents at the interfaces between layers 752 and 756, and between layers 754 and 758. Changing the charge current sign and its amplitude alters the orientation and magnitude of these spin-currents. It is noted that with the planar design of the GSHE layers shown in FIG. 7b, the spin-current orientation would be inplane and thus, FM-2 and FM-3 would require in-plane magnetic orientation. Note that the charge current IC injected into the top and bottom GSHE layers 752 and 754 have opposite directions such that the resulting spin-currents that are injected into layer 754 (FM-2) and 756 (FM-3) have the same spin orientation. Note that the spin-polarized currents are perpendicular to the plane of the figure in the same direction. In contrast, the magnetization orientation of FM-2 and FM-3 are in opposite directions as indicated by the symbols ⊙ and x respectively. FIG. 7c shows another STT MTJ 780 embodiment according to the present disclosure employing the SAFM 102 of the present disclosure. The synthetic anti-ferromagnet 102 shown in the FIG. 7c comprises two FM layers 782 and 784, which are antiferromagnetically coupled (indicated by the opposing magnetization direction arrows) via an ECL 786. The composite structure made up of the FM layers 782 and 784 and the ECL layer 786 make up the free layer of the MTJ 780. Driving currents shown by the arrows are injected via the electrode 788 shown in the figure into a reference layer 790 (FM-1). A tunnel barrier layer 794 separates the layers 782 and 790, as shown.

The MTJ structures 700 and 750 may be implemented as part of a variety of electronics devices, such as the memory cell of an electronic memory array, wherein the electrodes 708 are connected to the crossbars of the memory array and selectively energized for read/write operations.

The invention is inclusive of combinations of the aspects described herein. References to "a particular aspect" and the like refer to features that are present in at least one aspect of the invention. Separate references to "an aspect" (or "embodiment") or "particular aspects" or the like do not necessarily refer to the same aspect or aspects; however, such aspects are not mutually exclusive, unless so indicated or as are readily apparent to one of skill in the art. The use of singular or plural in referring to "method" or "methods" and the like is not limiting. The word "or" is used in this disclosure in a non-exclusive sense, unless otherwise explicitly noted.

The invention has been described in detail with particular reference to certain preferred aspects thereof, but it will be understood that variations, combinations, and modifications can be effected by a person of ordinary skill in the art within the spirit and scope of the invention.

The invention claimed is:

1. A magnetic tunnel junction device, comprising:
an upper fixed layer (reference layer) having a magnetic polarity in a first direction,
an upper tunnel barrier layer coupled to the upper fixed layer;
a free composite layer coupled to the upper tunnel barrier layer and comprising an anti-ferromagnet structure having an upper layer and a lower layer, the upper layer and the lower layer anti-ferromagnetically coupled by an exchange coupling layer, the upper and lower layers each having a magnetic polarity in a second and third directions, respectively, formed of a similar material but having differing volumes, wherein the first direction is parallel to one of the second or third directions, and
wherein the device is configured to inject symmetrically spin-polarized currents through the upper fixed layer, the upper tunnel barrier layer, and the free composite layer, wherein the injected spin-polarized current through the free composite layer passes through the upper and lower layers to achieve magnetic switching of the anti-ferromagnet structure such that each of the upper and lower layers of the free composite layer switch to opposite of the second and third directions, respectively, while the upper fixed layer remains in the first magnetic polarity direction,
wherein the upper and lower layers consist of cobalt and the exchange coupling layer consists of Ru, and
where ratio of volumes of the upper and lower layers are between 1.53 and 2.3, switching speed of the free composite layer is between 23 ps and 60 ps.

2. The device of claim 1, further comprising:
a lower fixed (reference) layer coupled to the lower layer, wherein the magnetic polarity of the lower fixed layer is opposite the first direction.

3. The device of claim 2, further comprising:
a) an upper electrode coupled to the upper fixed layer; and
b) a lower electrode coupled to the lower layer.

4. The device of claim 2, wherein the upper tunnel barrier layer comprises MgO.

5. The device of claim 1, wherein the upper and lower layers have an equal cross-sectional area and differing thicknesses.

6. A magnetic switching device, comprising:
an anti-ferromagnet structure having an upper layer and a lower layer, the upper layer and the lower layer anti-ferromagnetically coupled by an exchange coupling layer, the upper and lower layers each having a magnetic polarity in a second and third directions, respectively, formed of a similar material but having differing volumes, wherein the first direction is parallel to one of the second or third directions,
a) an upper giant spin hall effect (GSHE) layer coupled to the upper layer; and
b) a GSHE layer coupled to the lower layer,
wherein the upper and lower layers consist of cobalt and the exchange coupling layer consists of Ru, and
where ratio of volumes of the upper and lower layers are between 1.53 and 2.3, switching speed of the free composite layer is between 23 ps and 60 ps.

7. The device of claim 6, further comprising a current source configured to direct a upper switching current through the length of the upper GSHE layer and a lower switching current through the length of the lower GSHE layer, the direction of the upper switching current and the lower switching current being having opposite directions.

8. The device of claim 7, wherein the upper and lower switching currents result in spin-currents through the upper and lower layers having the same spin-orientation.

9. An electronic memory device, comprising:
a magnetic tunnel junction having a free composite layer comprising an anti-ferromagnet structure having an upper layer and a lower layer, the upper layer and lower layer anti-ferromagnetically coupled by an exchange coupling layer, the upper and lower layers each having a magnetic polarity in a second and third directions, respectively, formed of a similar material but having differing volumes, and
a) an upper fixed (reference) layer having a magnetic polarity in a first direction coupled to the upper layer by an upper tunnel barrier layer; and
b) lower fixed (reference) layer having a magnetic polarity opposite the first direction coupled to the lower layer by a lower tunnel barrier layer,
wherein the first direction is parallel to one of the second or third directions, and
wherein an injected spin-polarized current above a predetermined threshold through the free composite layer passes through the upper and lower layers causes magnetic switching of the anti-ferromagnet structure such that each of the upper and lower layers of the free composite layer switch to opposite of the second and third directions, respectively, while the upper and lower fixed layers remain in their respective magnetic directions,
wherein the upper and lower layers consist of cobalt and the exchange coupling layer consists of Ru, and
where ratio of volumes of the upper and lower layers are between 1.53 and 2.3, switching speed of the free composite layer is between 23 ps and 60 ps.

10. The electronic memory device of claim 9, further comprising:
a) an upper electrode coupled to the upper layer; and
b) a lower electrode coupled to the lower layer.

11. The electronic memory device of claim 9, wherein the upper and lower tunnel barrier layers comprise MgO.

12. The electronic memory device of claim 9, wherein the upper and lower layers have an equal cross-sectional area and differing thicknesses.

13. The electronic memory device of claim 9, further comprising:
   a) an upper giant spin hall effect (GSHE) layer coupled to the upper layer; and
   b) a lower giant spin hall effect layer coupled to the lower layer.

14. The electronic memory device of claim 13, further comprising a current source configured to direct a upper switching current through the length of the upper GSHE layer and a lower switching current through the length of the lower GSHE layer, the direction of the upper switching current and the lower switching current being having opposite directions.

15. The electronic memory of claim 14, wherein the upper and lower switching currents result in spin-currents through the upper and lower layers having the same spin-orientation.

* * * * *